US011742015B2

United States Patent
Yoon et al.

(10) Patent No.: US 11,742,015 B2
(45) Date of Patent: Aug. 29, 2023

(54) CONTROLLER AND MEMORY SYSTEM FOR REFRESHING MEMORY BASED ON FAIL BITS AND TEMPERATURE

(71) Applicant: SK hynix Inc., Icheon-si (KR)

(72) Inventors: Hyun Ju Yoon, Icheon-si (KR); Min Kang, Icheon-si (KR); Dong Uc Ko, Icheon-si (KR); Dong Keun Kim, Icheon-si (KR); Young Su Oh, Icheon-si (KR); Jun Hyun Chun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 15 days.

(21) Appl. No.: 17/340,922

(22) Filed: Jun. 7, 2021

(65) Prior Publication Data

US 2022/0165329 A1 May 26, 2022

(30) Foreign Application Priority Data

Nov. 23, 2020 (KR) .................. 10-2020-0158149

(51) Int. Cl.
*G11C 11/406* (2006.01)

(52) U.S. Cl.
CPC .. *G11C 11/40626* (2013.01); *G11C 11/40615* (2013.01)

(58) Field of Classification Search
CPC ........ G11C 11/40626; G11C 11/40615; G11C 11/40611; G11C 11/40618; G11C 11/4076; G11C 11/4096; G11C 2211/4062; G11C 29/42; G06F 3/0658; G06F 3/0659

See application file for complete search history.

(56) References Cited

U.S. PATENT DOCUMENTS

| 8,000,142 B1* | 8/2011 | Montierth ............ G11C 16/349 365/185.11 |
| 2006/0098510 A1* | 5/2006 | Jo ...................... G11C 11/40611 365/222 |
| 2014/0089577 A1* | 3/2014 | Lee ................... G11C 11/40615 711/106 |
| 2019/0139596 A1* | 5/2019 | Jang ................. G11C 11/40626 |

FOREIGN PATENT DOCUMENTS

| KR | 100656717 B1 | 12/2006 |
| KR | 101898885 B1 | 9/2018 |

* cited by examiner

*Primary Examiner* — Sultana Begum
(74) *Attorney, Agent, or Firm* — Perkins Coie LLP

(57) ABSTRACT

A memory system is provided to include a storage device including memory cells for storing data, and a controller in communication with an external device and configured to control the storage device based on a request from the external device. The controller is configured to receive a request from the external device to perform a refresh operation of re-writing stored data in the memory cells, read data from the memory cells included in the storage device, set a refresh period based on a number of fail bits included in the read data and a temperature of the controller or the storage device, and perform the refresh operation of the storage device based on the refresh period.

20 Claims, 11 Drawing Sheets

CONTROLLER AND MEMORY SYSTEM FOR REFRESHING MEMORY BASED ON FAIL BITS AND TEMPERATURE

CROSS-REFERENCE TO RELATED APPLICATION

This patent document claims priority to and benefits of the Korean patent application number 10-2020-0158149, filed on Nov. 23, 2020, which is incorporated herein by reference in its entirety.

TECHNICAL FIELD

The technology and implementations disclosed in this patent document generally relates to a controller and a memory system having the same, and more particularly, to a controller that performs a refresh operation and a memory system having the same.

BACKGROUND

An electronic data system may include one or more hosts and a memory system. A host may include a mobile phone or a computer, and the memory system may store or read data based on a request from the host. The memory system may include a memory device that stores data and a controller that controls the memory device. The memory device may be characterized as a volatile memory device or a nonvolatile memory device depending on its capability to hold stored data in the absence of power.

The volatile memory device retains the stored data while powered on but when the power is interrupted, the stored data is lost. Examples of the volatile memory device may include a dynamic random access memory (DRAM). The DRAM may include memory cells including capacitors and perform data input/output operations at high speed. However, the DRAM loses its data due to the memory cell configured of the capacitor. Therefore, the DRAM periodically performs a refresh operation to maintain the data stored in the memory cell.

SUMMARY

Implementations of the disclosed technology provide a controller capable of determining a refresh period based on the number of fail bits of data stored in a storage device and a temperature of a memory system and performing a self-refresh operation based on the determined period, and a memory system including the controller.

In one aspect of the disclosed technology, a memory system is provided to include a storage device including memory cells for storing data, and a controller in communication with an external device and configured to control the storage device based on a request from the external device. The controller is configured to receive a request from the external device to perform a refresh operation of re-writing stored data in the memory cells, read data from the memory cells included in the storage device, set a refresh period based on a number of fail bits included in the read data and a temperature of the controller or the storage device, and perform the refresh operation of the storage device based on the refresh period.

In another aspect of the disclosed technology, a controller is provided to include a command generator configured to receive a mode signal that is indicative of an operating mode that is either a refresh mode or a self-refresh mode and output a refresh command in the refresh mode in response to the mode signal or output, in the self-refresh mode, a read command to read data from a storage device in communication with the controller in response to the mode signal and further output, in the self-refresh mode, the refresh command in response to a refresh enable signal, an error correction engine configured to receive read data from the storage device, perform an error correction operation of the read data, and output a number of fail bits included in the read data, a temperature sensor configured to measure a temperature of at least one of the controller or the storage device and output temperature information on the measured temperature, and a period controller configured to calculate a refresh period based on the number of fail bits and the temperature information, and output the refresh enable signal based on the refresh period.

According to the implementations of the disclosed technology, a refresh operation can be more efficiently performed by determining a refresh period based on the number of fail bits of data stored in a storage device and a temperature of a memory system and performing a self-refresh operation based on the determined period.

DETAILED DESCRIPTION

Figure 1:
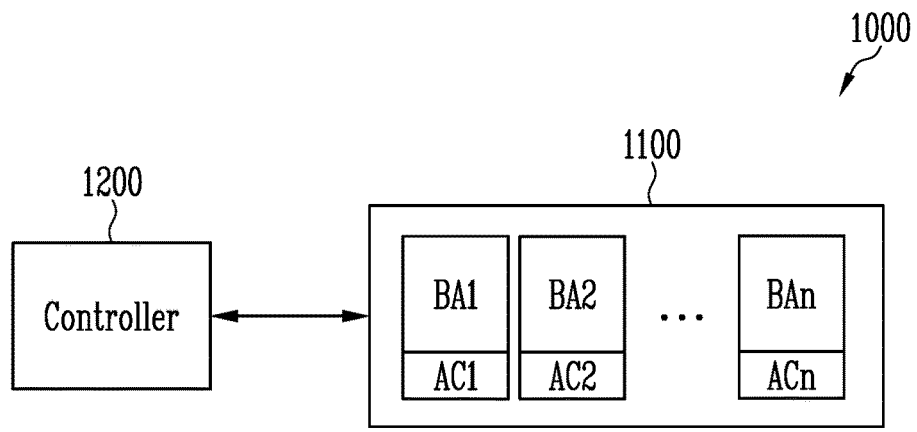
FIG. 1 is a diagram illustrating a memory system based on an embodiment of the disclosed technology.

FIG. 1 is a diagram illustrating a memory system according to an embodiment of the disclosed technology.

Referring to FIG. 1, the memory system 1000 may include a storage device 1100 capable of storing data and a controller 1200 configured to control the storage device 1100.

The storage device 1100 may include a volatile memory. The storage device 1100 may include first to n-th (n is a positive integer) banks BA1 to BAn in which data may be stored and first to n-th active circuits AC1 to ACn configured to supply a precharge voltage to the first to n-th banks BA1 to BAn during a refresh operation. The first to n-th banks BA1 to BAn may include a plurality of memory cells. The first to n-th active circuits AC1 to ACn may be connected to the first to n-th banks BA1 to BAn, respectively. The memory cells included in the first to n-th banks BA1 to BAn may be connected to word lines.

The volatile memory may include a dynamic RAM (DRAM) or a synchronous DRAM (SDRAM), and may include various types of memory. For example, the storage device 1100 may include various types of memories that require a refresh operation to maintain data over time.

In the refresh operation, the data stored in the memory cells are read out and re-written to reduce undesired data degradation.

The controller 1200 may be configured to control the storage device 1100. For example, the controller 1200 may output control signals for performing various operations to the storage device 1100 in response to various requests output from an external device (for example, a host). For example, the controller 1200 may output a refresh command for performing the refresh operation and a read command for performing a read operation. The controller 1200 may output, to the storage device 1100, the row address for selecting the word line and active control signals for controlling the active circuit. In addition, the controller 1200 may output various other control signals for facilitating the read operation or the refresh operation.

In some implementations, the controller 1200 may operate in a refresh mode or a self-refresh mode based on the request from the external device. The controller 1200 may perform the refresh operation in the refresh mode only when a refresh request is received from the external device. The controller 1200 may perform the refresh operation in the self-refresh mode every specific period from when a self-refresh request is received from the external device to when a refresh end request is received. When the self-refresh mode is started, the controller 1200 according to the present embodiment may perform the read operation and count the number of fail bits included in read data. The controller 1200 may determine a period for performing the refresh operation based on the counted number of fail bits and a temperature, and may perform the refresh operation based on the determined period. The controller 1200 may periodically perform the refresh operation based on the determined period until the refresh end request is received. The controller 1200 may end the self-refresh mode when the refresh end request is received.

Figure 2:
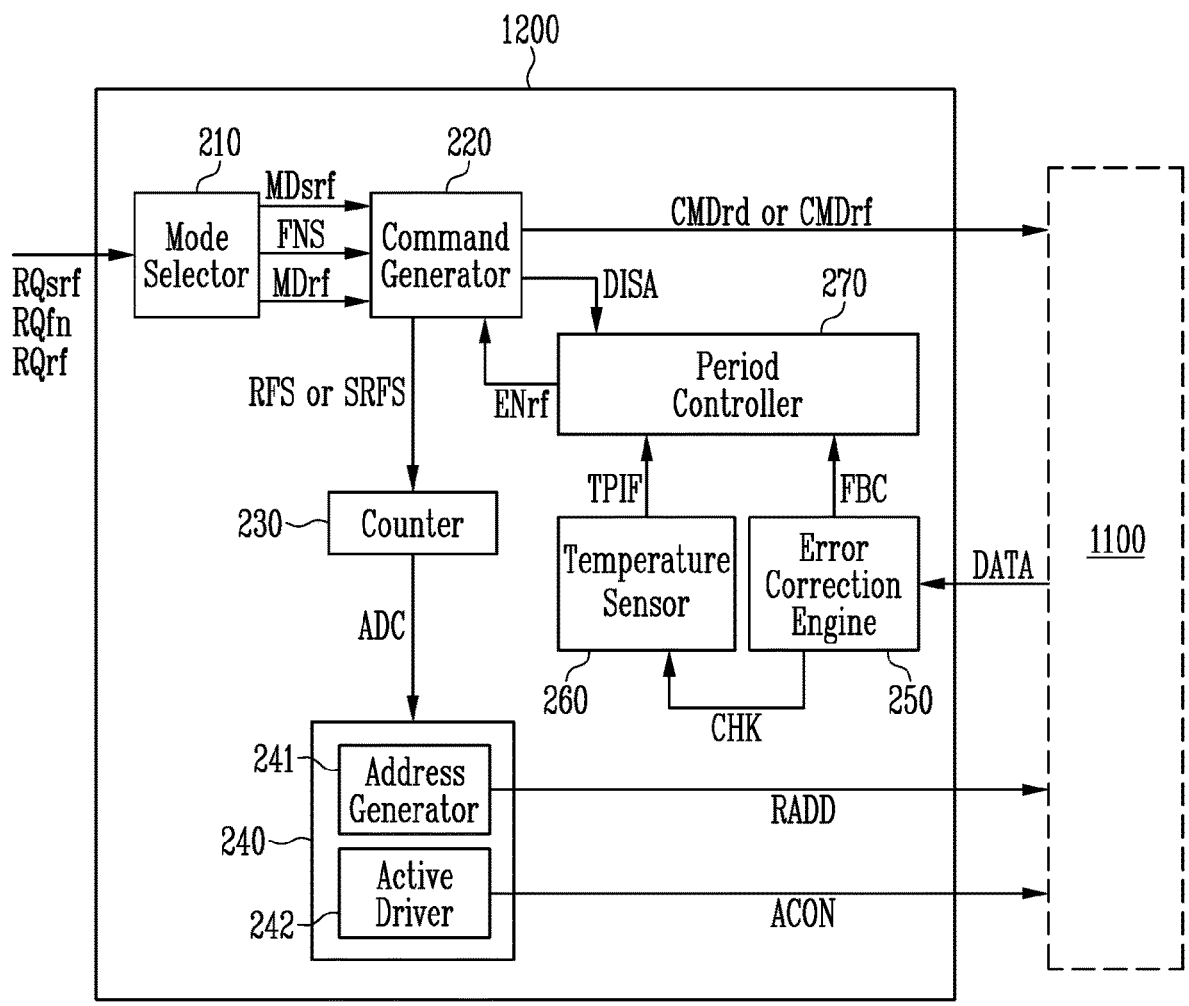
FIG. 2 is a diagram illustrating an example of a controller shown in FIG. 1.

FIG. 2 is a diagram illustrating an example of the controller shown in FIG. 1.

Referring to FIG. 2, the controller 1200 may include a mode selector 210, a command generator 220, a counter 230, an address controller 240, and an error correction engine 250, a temperature sensor 260, and a period controller 270.

The mode selector 210 may be configured to receive various requests from the external device and output signals in response to the received request. The various requests from the external device may include a self-refresh request RQsrf, a refresh end request RQfn and a refresh request RQrf. The signals output from the mode selector 210 may include a self-refresh mode signal MDsrf, an end signal FNS, and a refresh mode signal MDrf. When the mode selector 210 receives a self-refresh request RQsrf, the refresh end request RQfn, and the refresh request RQrf, the mode selector 210 may output the self-refresh mode signal MDsrf, the end signal FNS, and the refresh mode signal MDrf, respectively. For example, the mode selector 210 may output the self-refresh mode signal MDsrf in response to the self-refresh request RQsrf, output the end signal FNS in response to the refresh end request RQfn, and output the refresh mode signal MDrf in response to the refresh request RQrf.

The command generator 220 may be configured to output commands and signals corresponding to different modes in response to the self-refresh mode signal MDsrf, the end signal FNS, or the refresh mode signal MDrf. For example, when the self-refresh mode signal MDsrf is received, the command generator 220 may output a self-refresh signal SRFS and a read command CMDrd, and when a refresh enable signal ENrf is received, the command generator 220 may output a self-refresh signal SRFS and a refresh command CMDrf. In some implementations, the self-refresh signal SRFS and the read command CMDrd may be output in sequence from the command generator 220. The refresh enable signal ENrf is output from the period controller 270 which will be further explained later with reference to FIG. 3. The self-refresh signal SRFS may be transmitted to the counter 230 and the read command CMDrd may be transmitted to the storage device 1100. The command generator 220 may output a disable signal DISA when the end signal FNS for ending the self-refresh mode is received. The disable signal DISA may be transmitted to the period controller 270. The command generator 220 may output the self-refresh signal SRFS and the refresh command CMDrf whenever the refresh enable signal ENrf is received until the end signal FNS is received. When the refresh mode signal MD is received, the command generator 220 may output the refresh signal RFS and the refresh command CMDrf. In some implementations, the refresh signal RFS and the refresh command CMDrf may be output in sequence from the command generator 220. The refresh signal RFS may be transmitted to the counter 230, and the refresh command CMDrf may be transmitted to the storage device 1100.

The counter 230 may output an address count value ADC for selecting an address in response to the self-refresh signal SRFS or the refresh signal RFS. For example, when the self-refresh signal SRFS is received, the counter 230 may output the address count value ADC set as a default, and when the refresh signal RFS is received, the counter 230 may increase the address count value ADC. For example, the counter 230 may incrementally increase the address count value ADC each time the refresh signal RFS is received, and output the address count value ADC of which a value is increased.

The address controller 240 may output the row address RADD and the active control signal ACON of the memory cells in which the read operation or the refresh operation is to be performed according to the address count value ADC. For example, the address controller 240 may include an address generator 241 and an active driver 242. The address generator 241 may output the row address RADD in response to the address count value ADC. The active driver 242 may output the active control signal ACON in response to the address count value ADC. An active circuit is selected among the first to n-th active circuits AC1 to ACn included in the storage device 1100 and the selected active circuit may operate according to the active control signal ACON. A word line included in the bank may be selected according to the row address RADD. For example, when the address count value ADC is a default value, a first word line may be selected, and each time the address count value ADC increases, a next word line may be selected.

The error correction engine 250 may check an error of data DATA read from the selected memory cells of the storage device 1100, and output the number of fail bits FBC included in the read data DATA. The error correction engine 250 may output the check signal CHK when outputting the number of fail bits FBC. The number of fail bits FBC may be transmitted to the period controller 270, and the check signal CHK may be transmitted to the temperature sensor 260.

The temperature sensor 260 may be configured to check the temperature of the controller 1200 or the storage device 1100, or check the temperature of each of the controller 1200 and the storage device 1100. The temperature sensor 260 may output temperature information TPIF, which is information on the temperature checked in response to the check signal CHK. The temperature information TPIF may be transmitted to the period controller 270.

The period controller 270 may calculate the refresh period based on the number of fail bits FBC and the temperature information TPIF, and may periodically output the refresh enable signal ENrf based on the calculated refresh period. When the disable signal DISA is received, the period controller 270 may initialize the period and stop outputting the refresh enable signal ENrf.

A configuration of the period controller 270 is described in more detail with reference to FIG. 3.

Figure 3:
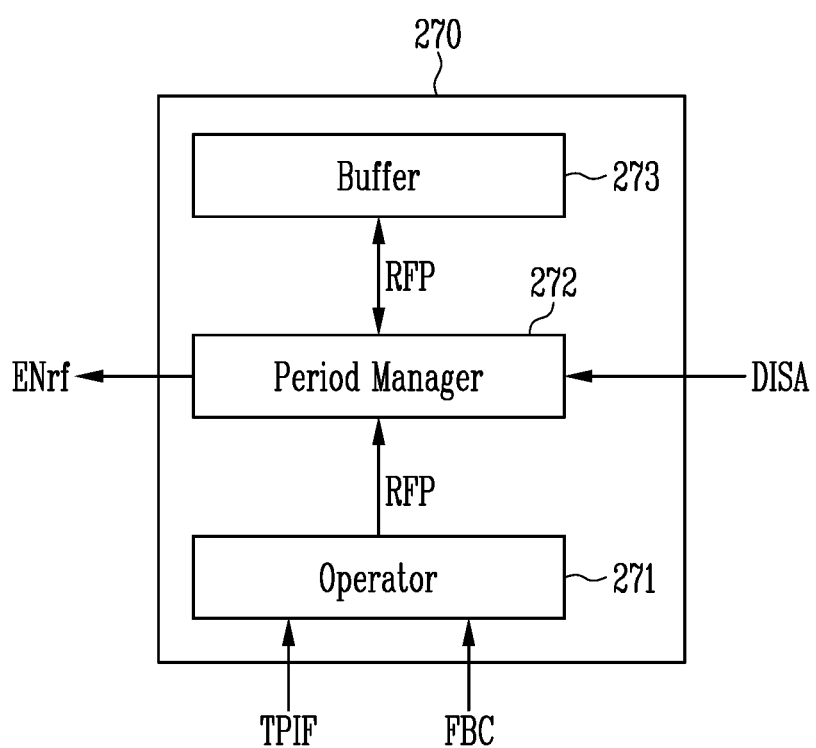
FIG. 3 is a diagram illustrating an example of a period controller shown in FIG. 2.

FIG. 3 is a diagram illustrating an example of the period controller shown in FIG. 2.

Referring to FIG. 3, the period controller 270 may include an operator 271, a period manager 272, and a buffer 273.

The operator 271 may calculate the refresh period RFP by performing an operation based on the number of fail bits FBC and the temperature information TPIF. Thus, the operator 271 may calculate the refresh period RFP according to the number of fail bits and the temperature. For example, the operator 271 may shorten the refresh period REP as the number of fail bits increases, and may lengthen the refresh period REP as the number of fail bits decreases. The operator 271 may shorten the refresh period RFP as the temperature increases, and may lengthen the refresh period RFP as the temperature decreases.

When the refresh period RFP output from the operator 271 is received, the period manager 272 may store the received refresh period RFP in the buffer 273 and output the refresh enable signal ENrf. The period manager 272 may count a time after outputting the refresh enable signal ENrf, and periodically outputs the refresh enable signal ENrf based on the period stored in the buffer 273. When the disable signal DISA is received, the period manager 272 may initialize the buffer 273 in which the refresh period RFP is stored, and may stop outputting the refresh enable signal ENrf.

Figure 4:
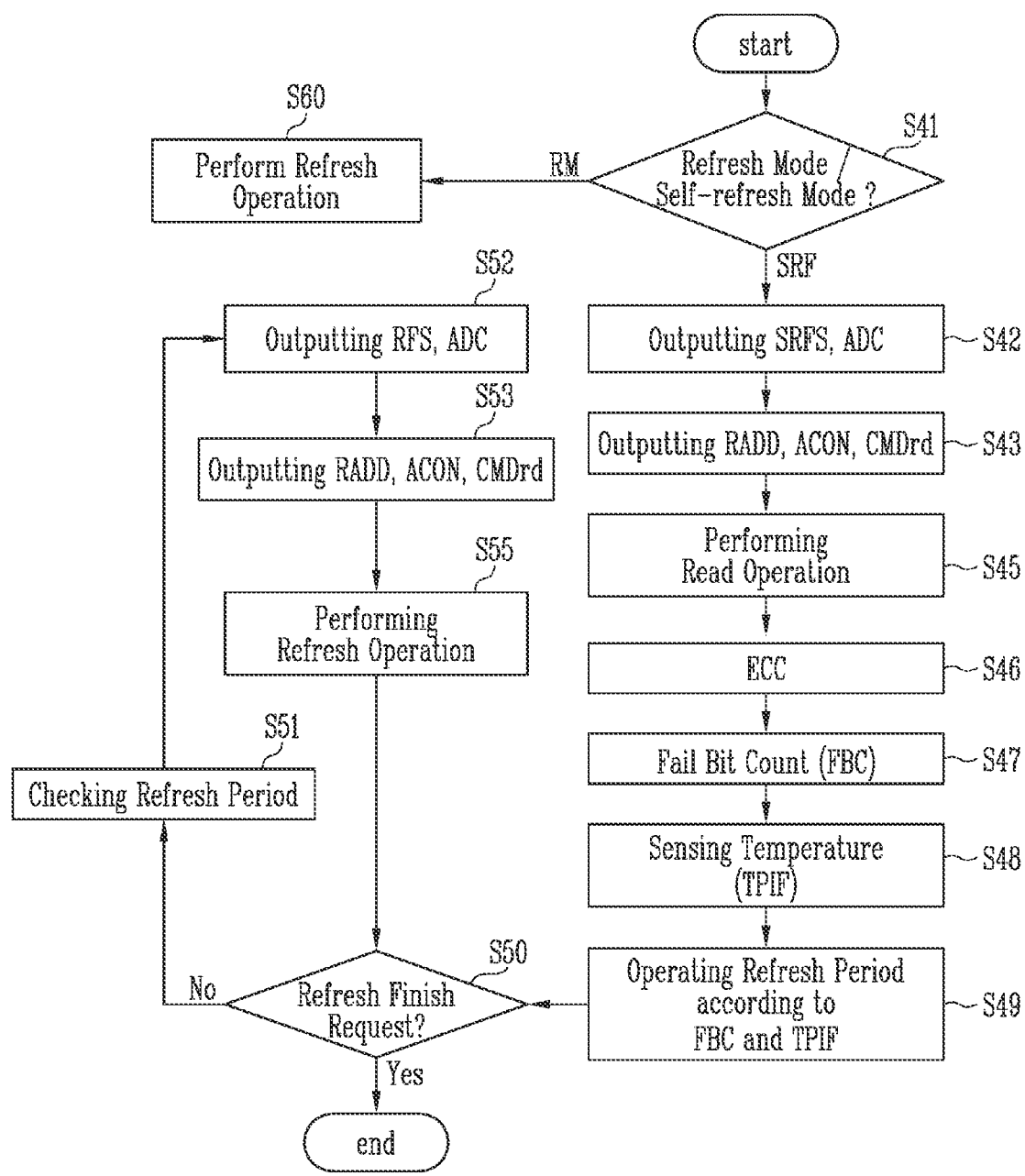
FIG. 4 is a flowchart illustrating a self-refresh operation based on an embodiment of the disclosed technology.

FIG. 4 is a flowchart illustrating a self-refresh operation according to an embodiment of the disclosed technology.

Referring to FIGS. 4 and 2, the controller 1200 may operate in the refresh mode or the self-refresh mode based on the request output from the external device (for example, a host) (S41). When the request received from the controller 1200 is the refresh request RM, the controller 1200 may perform the refresh operation for the selected bank (S60). For example, the refresh operation can be performed a predetermined number of times. For example, the predetermined number of times may be once. The refresh operation performed in the refresh mode may correspond to one generally performed in the art and thus detailed descriptions thereof are omitted. With reference to FIG. 4, the self-refresh operation performed in the self-refresh mode is discussed in more detail.

When the request received from the controller 1200 is the self-refresh request SRF, the command generator 220 may output the self-refresh signal SRFS for the read operation, and the counter 230 may output the address count value ADC in response to the self-refresh signal SRFS (S42). The address count value ADC output in response to the self-refresh signal SRFS may have a default value.

The address controller 240 may output the row address RADD and the active control signal ACON based on the address count value ADC (S43). Since the address count value ADC output in step S42 has the default value, the row address RADD may be a first row address. In the present embodiment, the first row address is selected during the read operation, but a plurality of row addresses may be sequentially output so that at least one or more word lines among a plurality of word lines included in the bank are sequentially selected.

When the address is selected in step S43, the command generator 220 may output the read command CMDrd for the read operation. For example, in step S43, the read command CMDrd, the row address RADD, and the active control signal ACON may be transmitted to the storage device.

Among the plurality of banks included in the storage device, a bank connected to the active circuit selected based on the active control signal ACON may be selected, and one word line among the plurality of word lines included in the selected bank may be selected based on the row address RADD. Subsequently, the read operation may be performed on the memory cells connected to the selected word line (S45). The storage device may output the data read from the memory cells connected to the selected word line to the controller 1200.

The error correction engine 250 included in the controller 1200 may decode the read data (S46), count the number of fail bits according to a decoding result, and output the number of fail bits FBC (S47).

The temperature sensor 260 included in the controller 1200 may sense the temperature of at least one of the controller 1200 or the storage device 1100 and output the temperature information TPIF on the sensed temperature (S48).

The period controller 270 may calculate the refresh period according to the number of fail bits FBC and the temperature information TPIF (S49). For example, the period controller 270 may determine the refresh period based on the temperature information and then control or adjust the refresh period based on the number of fail bits FBC.

The period controller 270 may determine whether the refresh end request is received (S50). When the refresh end request is not received (No), the period controller 270 may check the refresh period (S51). In step S50, when the disable signal DISA is not received, the period controller 270 may determine that the refresh end request is not received.

In step S51, the period controller 270 may output the refresh enable signal ENrf when the refresh period is first generated, and thereafter, the period controller 270 may periodically output the refresh enable signal ENrf in accordance with the refresh period.

The refresh enable signal ENrf may be input to the command generator 220, the command generator 220 may output the refresh signal RFS for the refresh operation in response to the refresh enable signal ENrf, and the counter 230 may output the address count value ADC in response to the refresh signal RFS (S52). The address count value ADC output in response to a first refresh signal RFS may have the default value, and the address count value ADC may be incrementally increase from a second refresh signal RFS.

The address controller 240 may output the row address RADD and the active control signal ACON based on the address count value ADC (S53).

When the address is selected in step S53, the command generator 220 may output the refresh command CMDrf to perform the refresh operation. For example, in step S53, the refresh command CMDrf, the row address RADD, and the active control signal ACON may be transmitted to the storage device.

Among the plurality of banks included in the storage device, the bank connected to the active circuit selected based on the active control signal ACON may be selected, and one word line among the plurality of word lines included in the selected bank may be selected based on the row address RADD. Subsequently, the refresh operation may be performed on the memory cells connected to the selected word line (S55).

When the refresh operation on all memory cells included in the bank selected is completed in step S55, the period controller 270 may determine whether the refresh end request is received (S50), and when the refresh end request is not received (No), the period controller 270 may check the refresh period (S51).

When the time corresponding to the period stored in the step S51 comes, steps S52 to S55 may be performed again on the selected bank. That is, the refresh operation of the selected bank may be performed again by steps S52 to S55.

In step S50, when the disable signal DISA is received from the period controller 270 in response to the refresh end request, that is, the refresh end request is received (Yes), the controller 1200 may end the self-refresh mode.

Figure 5:
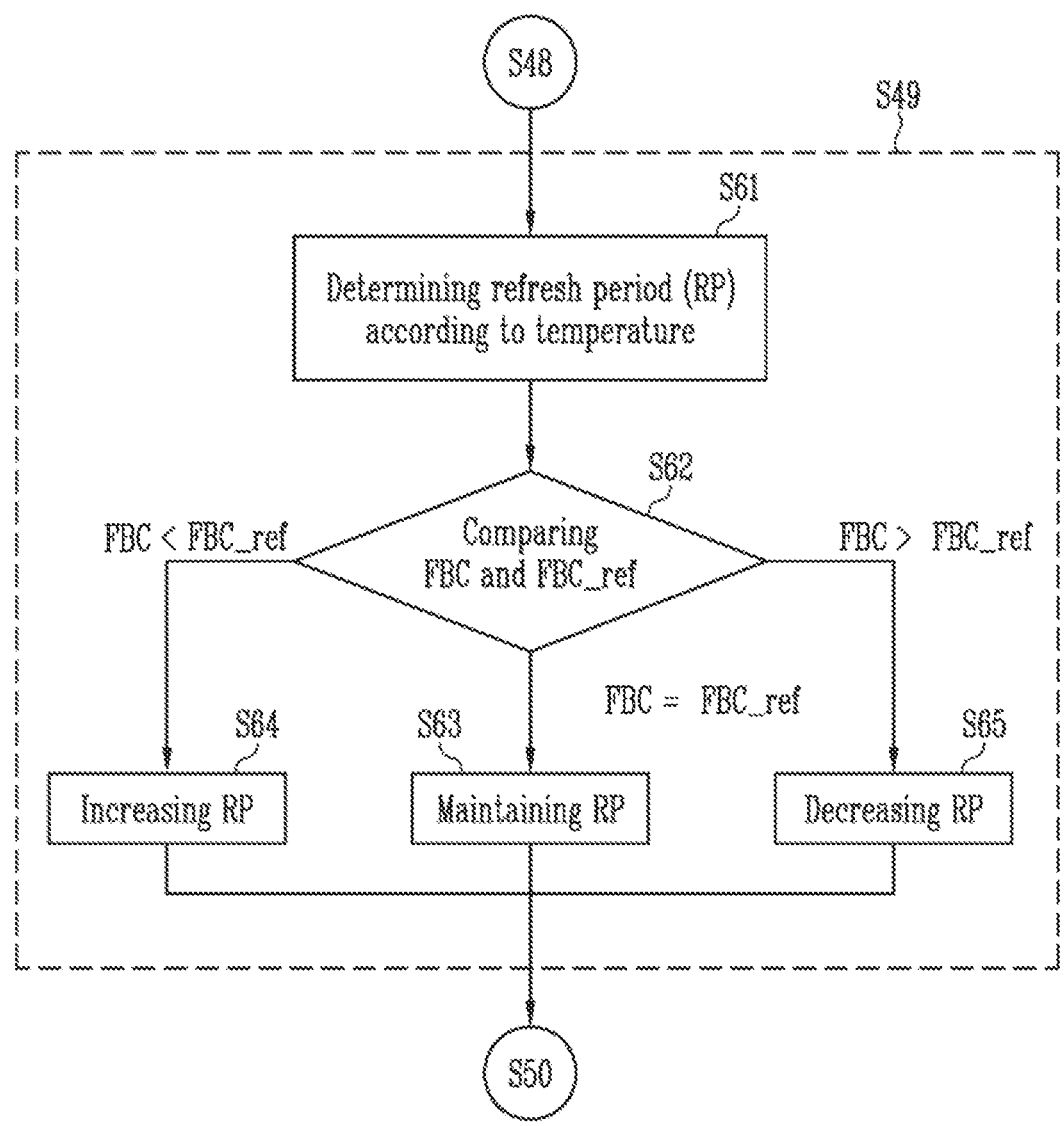
FIG. 5 is a flowchart specifically illustrating a step of operating a refresh period described with reference to FIG. 4.

FIG. 5 is a flowchart illustrating a step of operating the refresh period described with reference to FIG. 4.

Referring to FIG. 5, in operating the refresh period (S49) described with reference to FIG. 4, after the refresh period RP is determined based on the temperature, the refresh period RP may be determined based on the number of fail bits FBC. For example, when operating the refresh period (S49) is started, the period controller 270 of FIG. 2 may determine the refresh period RP based on the temperature sensed in step S48 (S61). For example, the refresh period RP may be set to be longer as the temperature decreases, and may be set to be shorter as the temperature increases. For example, a plurality of temperature ranges may be defined, and the period controller 270 may determine the refresh period RP based on the temperature range in which the sensed temperature is included.

When the refresh period RP is determined based on the temperature, the period controller 270 may maintain or control the refresh period RP based on the number of fail bits FBC. For example, the period controller 270 may compare the number of fail bits FBC counted in step S47 of FIG. 4 with the reference number of fail bits FBC_ref (S62). Here, the reference number of fail bits FBC_ref may be a preset fixed value or may be the number of fail bits counted in a previous operation.

In step S62, when it is determined that the number of fail bits FBC is equal to the reference number of fail bits FBC_ref (FBC=FBC_ref), the period controller 270 may maintain the refresh period RP determined in step S61 (S63).

In step S62, when it is determined that the number of fail bits FBC is less than the reference number of fail bits FBC_ref (FBC<FBC_ref), the period controller 270 may increase the refresh period RP determined in step S61 (S64).

In step S62, when it is determined that the number of fail bits FBC is greater than the reference number of fail bits FBC_ref (FBC>FBC_ref), the period controller 270 may decrease the refresh period RP determined in step S61 (S65).

The refresh period RP determined in any one of steps S63 to S65 may be a final refresh period RP. When the final refresh period RP is determined, step S50 may be performed.

Figure 6A:
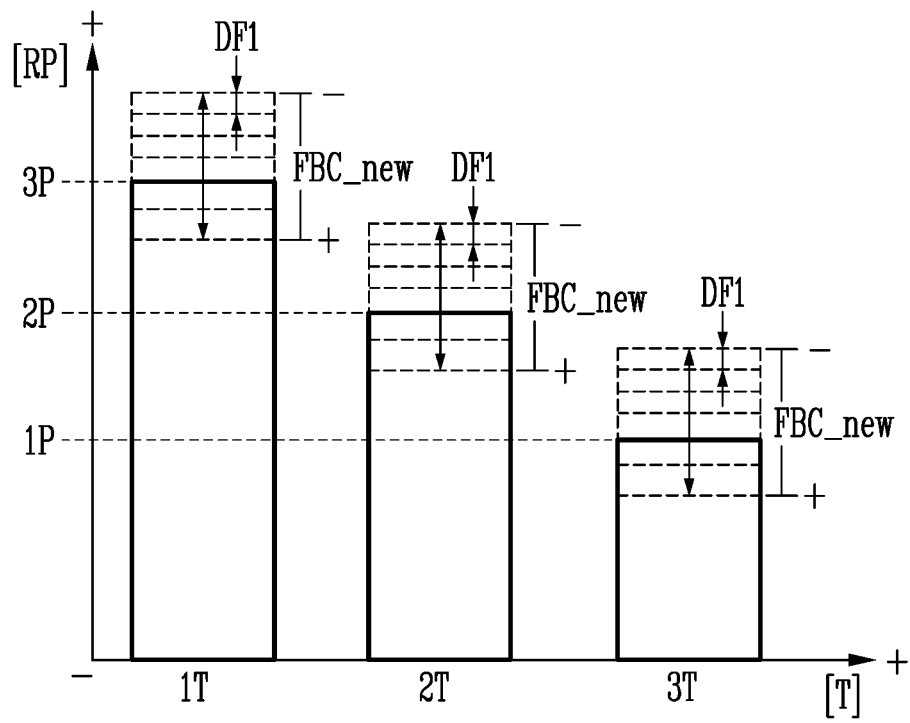
FIG. 6A is a diagram illustrating a first embodiment of determining a refresh period.

FIG. 6A is a diagram illustrating a first embodiment of determining a refresh period.

Referring to FIG. 6A, the refresh period RP may be firstly determined based on the sensed temperature T and then controlled or adjusted based on the number of newly counted fail bits FBC_new. For example, assume that the temperature T can fall within one of three ranges 1T, 2T, and 3T. 1T is the lowest temperature range, 2T is a temperature range higher than 1T, and 3T is a temperature range higher than 2T. When the sensed temperature T is included in 1T, the refresh period RP may be determined as 3P. In FIG. 6A, 3P is a refresh period RP longer than 2P, and 2P is a refresh period RP longer than 1P. Subsequently, as the number of newly counted fail bits FBC_new decreases (−), the refresh period RP may be controlled or adjusted to be longer than 3P, and as the number of newly counted fail bits FBC_new increases (+), the refresh period RP may be controlled or adjusted to be shorter than 3P. The refresh period RP may be determined based on a result of comparison of the number of newly counted fail bits FBC_new with the reference number of fail bits FBC_ref. For example, when the number of newly counted fail bits FBC_new is less than the reference number of fail bits FBC_ref, and as a difference of the number increases, the refresh period RP may be controlled or adjusted to be longer in '−' direction. When the number of newly counted fail bits FBC_new is greater than the reference number of fail bits FBC_ref, and as the difference of the number increases, the refresh period RP may be controlled or adjusted to be shorter in '+' direction.

When the sensed temperature T falls in the 2T range, the refresh period RP may be firstly determined as 2P, and the refresh period RP may be controlled or adjusted to be longer or shorter based on the number of newly counted fail bits FBC_new. When the sensed temperature T falls in the 3T range, the refresh period RP may be firstly determined as 1p, and the refresh period RP may be controlled or adjusted to be longer or shorter based on the number of newly counted fail bits FBC_new.

In the first embodiment shown in FIG. 6A, the refresh period RP may be controlled based on the same first step period DF1 based on the difference between the number of newly counted fail bits FBC_new and the reference number of fail bits FBC_ref regardless of the sensed temperature T. For example, when the sensed temperature T falls in 1T and the difference between the number of newly counted fail bits FBC_new and the reference number of fail bits FBC_ref is 1 in the '−' direction, the refresh period RP may be controlled or adjusted to be longer than 3P by the first step period DF1. When the sensed temperature T falls in 2T and the difference between the number of newly counted fail bits FBC_new and the reference number of fail bits FBC_ref is 1 in the '−' direction, the refresh period RP may be controlled or adjusted to be longer than 2P by the first step period DF1. When the sensed temperature T falls in 3T and the difference between the number of newly counted fail bits FBC_new and the reference number of fail bits FBC_ref is 1 in the '−' direction, the refresh period RP may be controlled or adjusted to be longer than 1P by the first step period DF1.

In another example, when the sensed temperature T falls in 1T and the difference between the number of newly counted fail bits FBC_new and the reference number of fail bits FBC_ref is 2 in the '+' direction, the refresh period RP may be controlled or adjusted to be shorter than 3P by twice the first step period DF1. When the sensed temperature T falls in 2T and the difference between the number of newly counted fail bits FBC_new and the reference number of fail bits FBC_ref is 2 in the +' direction, the refresh period RP may be controlled or adjusted to be shorter than 2P by twice the first step period DF1. When the sensed temperature T falls in 3T and the difference between the number of newly counted fail bits FBC_new and the reference number of fail bits FBC_ref is 2 in the '+' direction, the refresh period RP may be controlled or adjusted to be shorter than 1P by twice the first step period DF1.

While a unit for controlling the refresh period RP based on the number of newly counted fail bits FBC_new is the same regardless of the temperature T in the above-described embodiment, a step period of the refresh period RP may be set differently based on the temperature T as discussed in another embodiment presented below.

Figure 6B:
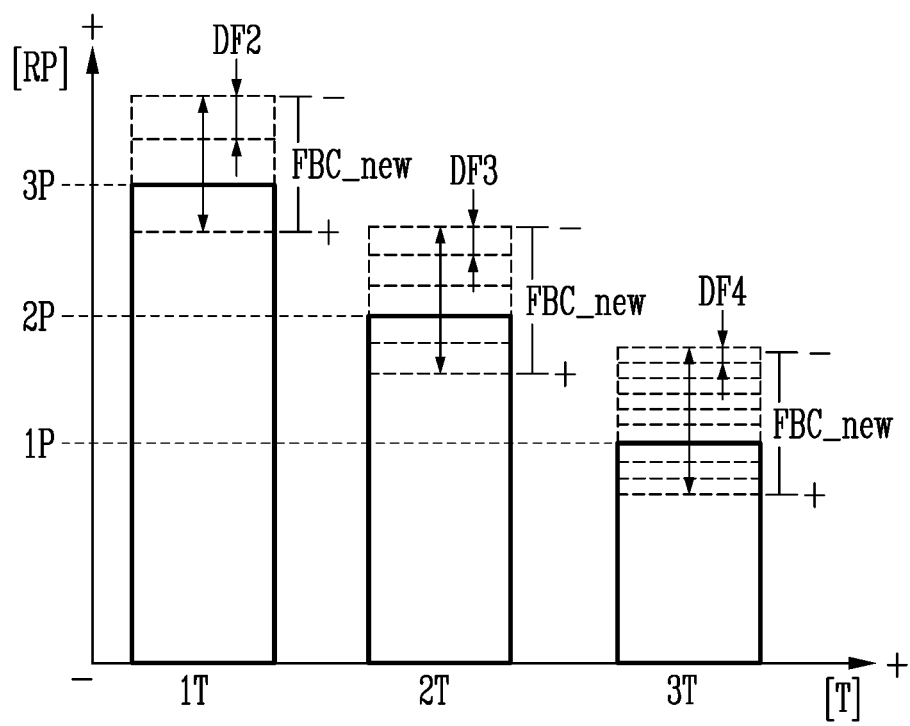
FIG. 6B is a diagram illustrating a second embodiment of determining a refresh period.

FIG. 6B is a diagram illustrating a second embodiment of determining a refresh period.

The refresh operation is required to be more frequently performed as the sensed temperature T increases. Thus, in the second embodiment, the step period for controlling the refresh period RP may be set to be relatively short as the temperature T increases, and the step period for controlling the refresh period RP may be set to be relatively long as the temperature T decreases.

For example, when the sensed temperature is 1T, the refresh period RP may be controlled or adjusted by a unit of a second step period DF2 based on the difference between the number of newly counted fail bits FBC_new and the reference number of fail bits FBC_ref. When the sensed temperature is 2T, which is higher than 1T, the refresh period RP may be controlled or adjusted by a unit of a third step period DF3 shorter than the second step period DF2 based on the difference between the number of newly counted fail bits FBC_new and the reference number of fail bits FBC_ref. When the sensed temperature is 3T, which is higher than 2T, the refresh period RP may be controlled or adjusted based on a unit of a fourth step period DF4 shorter than the third step period DF3 based on the difference between the number of newly counted fail bits FBC_new and the reference number of fail bits FBC_ref.

Thus, reliability of the memory system 1000 can be improved by precisely controlling the refresh period RP as the sensed temperature T increases.

Figure 7A:
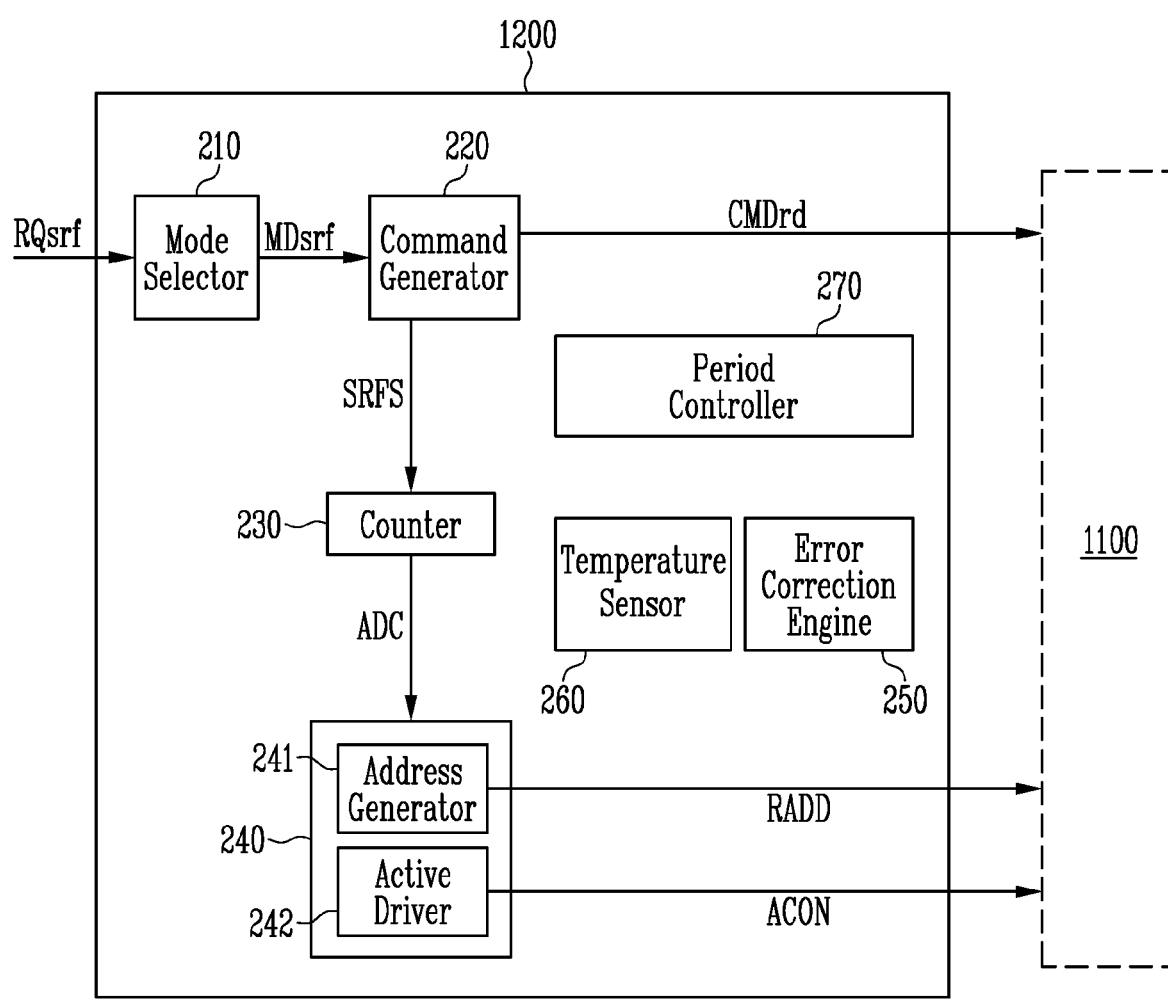
FIGS. 7A to 7C are diagrams sequentially illustrating a method of operating a controller in a self-refresh mode of some implementations of the disclosed technology.
Figure 7B:
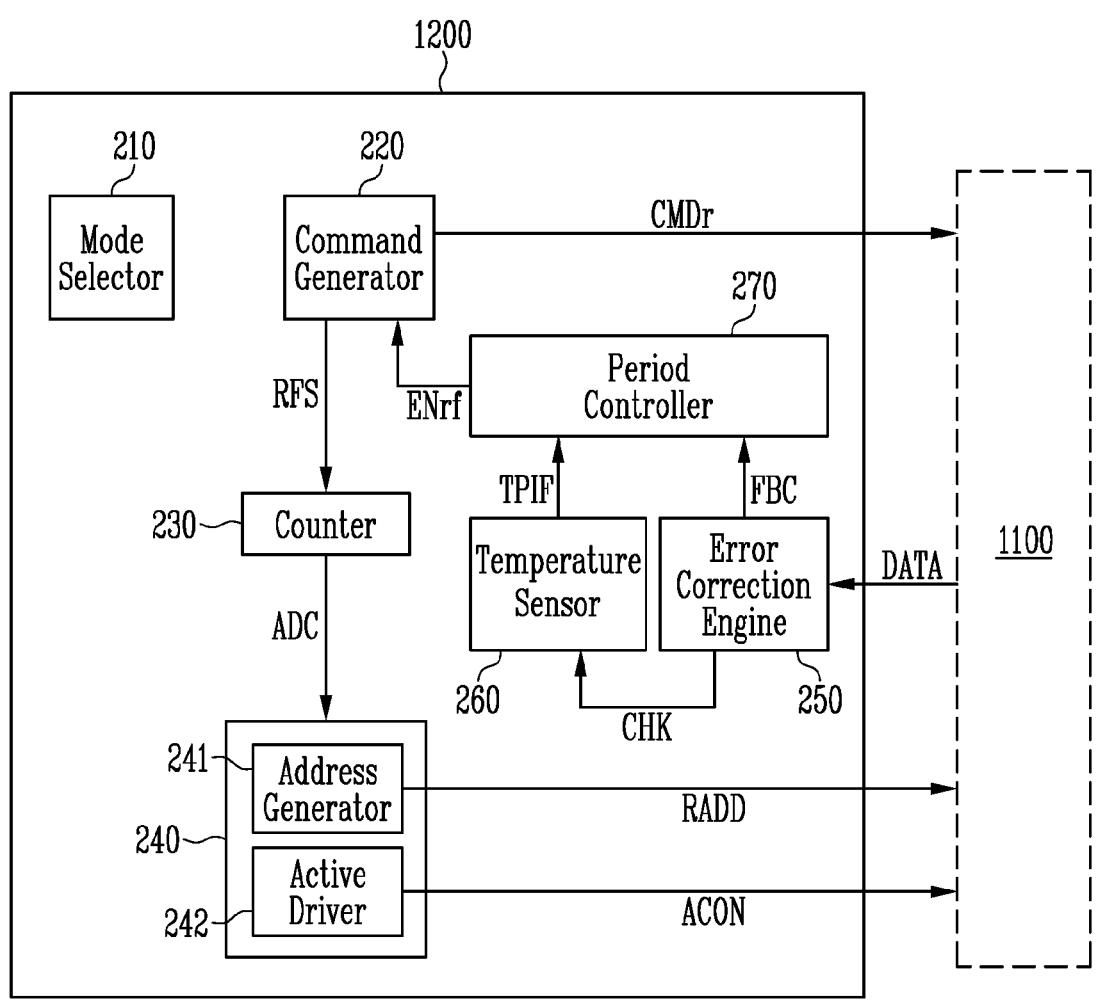
Figure 7C:
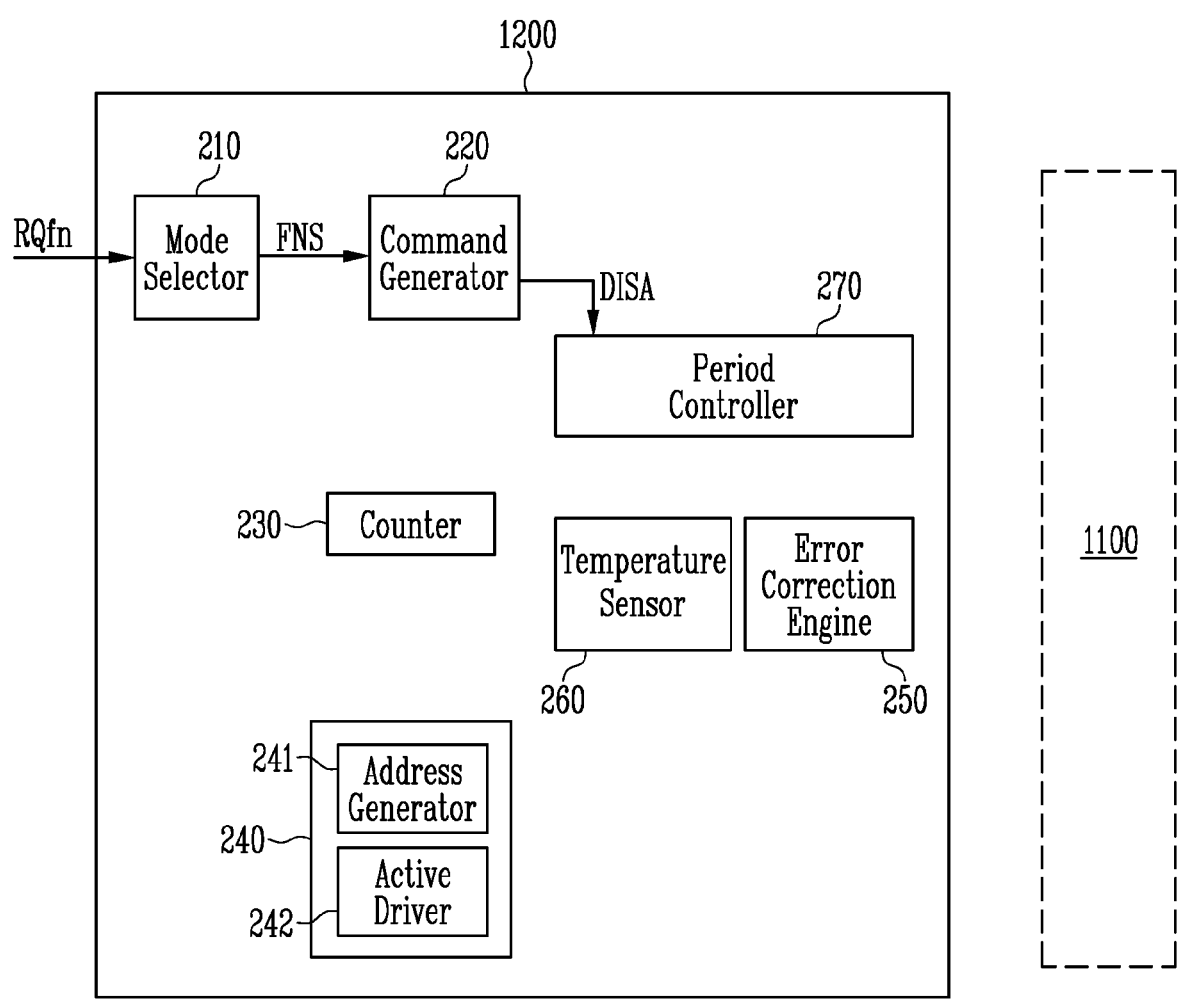

FIGS. 7A to 7C are diagrams sequentially illustrating a method of operating a controller in a self-refresh mode of the disclosed technology.

Referring to FIG. 7A, when the self-refresh request RQsrf is received, the mode selector 210 may output the self-refresh mode signal MDsrf. The command generator 220 may sequentially output the self-refresh signal SRFS and the read command CMDrd in response to the self-refresh mode signal MDsrf. The counter 230 may output the address count value ADC set as the default in response to the self-refresh signal SRFS. The address controller 240 may output the row address RADD of the selected word line and the active control signal ACON according to the address count value ADC. For example, the address generator 241 may output the row address RADD, and the active driver 242 may output the active control signal ACON.

The storage device 1100 may perform the read operation of the memory cells connected to the selected word line of the selected bank in response to the read command CMDrd, the row address RADD, and the active control signal ACON.

Referring to FIG. 7B, when the read operation is completed, the storage device 1100 may output the read data DATA to the controller 1200. The error correction engine 250 of the controller 1200 may check an error of the data DATA output from the storage device 1100 and output the number of checked fail bits FBC. When the error correction engine 250 outputs the number of fail bits FBC, the error correction engine 250 may output the check signal CHK to the temperature sensor 260. The temperature sensor 260 may output the temperature information TPIF on the sensed temperature in response to the check signal CHK.

The period controller 270 may set the refresh period according to the temperature information TPIF and the number of fail bits FBC, and may output the refresh enable signal ENrf to the command generator 220 at each set period.

The command generator 220 may sequentially output the refresh signal RFS and the refresh command CMDrf in response to the refresh enable signal ENrf. The counter 230 may output the address count value ADC in response to the refresh signal RFS. The address controller 240 may output the active control signal ACON and the row address RADD of the word line selected according to the address count value ADC. For example, the address generator 241 may output the row address RADD, and the active driver 242 may output the active control signal ACON.

The storage device 1100 may perform the refresh operation of the selected bank in response to the refresh command CMDrf.

The period controller 270 may periodically perform the refresh operation of the banks included in the storage device 1100 by outputting the refresh enable signal ENrf to the command generator 220 for each set period.

Referring to FIG. 7C, when the refresh end request RQfn is received from the mode selector 210, the mode selector 210 may output the end signal FNS. The command generator 220 may output the disable signal DISA to the period controller 270 in response to the end signal FNS. When the disable signal DISA is received, the period controller 270 ends the self-refresh mode and does not output the refresh enable signal ENrf.

Figure 8:
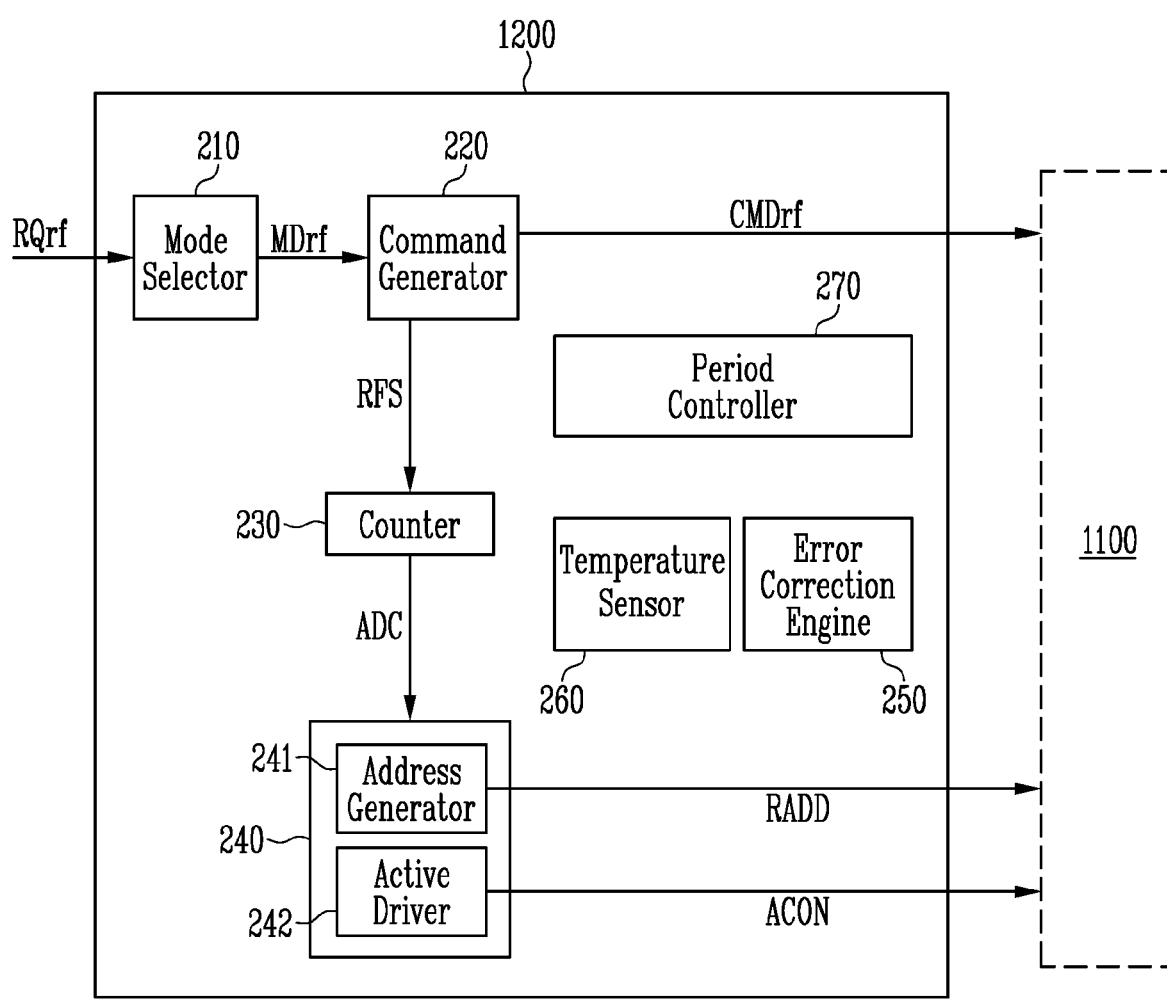
FIG. 8 is a diagram illustrating a method of operating a controller in a refresh mode of some implementations of the disclosed technology.

FIG. 8 is a diagram illustrating a method of operating a controller in a refresh mode of the disclosed technology.

Referring to FIG. 8, when the refresh request RQrf is received, the mode selector 210 may output the refresh mode signal MDrf. The command generator 220 may sequentially output the refresh signal RFS and the refresh command CMDrf in response to the refresh mode signal MDrf. The counter 230 may output the address count value ADC in response to the refresh signal RFS. The address controller 240 may output the active control signal ACON and the row address RADD of the word line selected according to the address count value ADC. For example, the address generator 241 may output the row address RADD, and the active driver 242 may output the active control signal ACON.

The storage device 1100 may perform the refresh operation of the selected bank in response to the refresh command CMDrf.

Figure 9:
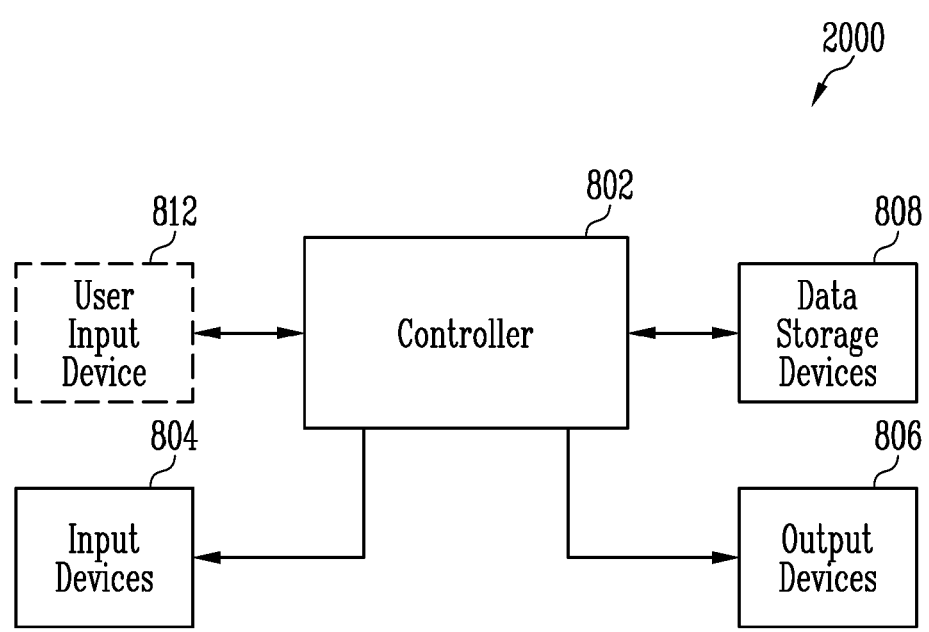
FIG. 9 is a diagram illustrating a data processing device that includes a controller based on some implementations of the disclosed technology.

FIG. 9 is a diagram illustrating a data processing device to which a controller according to an embodiment of the disclosed technology is applied.

Referring to FIG. 9, the data processing device 2000 may include a controller 802, an input device 804, an output device 806, and a data storage device 808. In addition, for user convenience, the data processing device 2000 of FIG. 9 may further include a user input device 812. The user input device 812 may be a device including a numeric key, a function key, and the like, and may serve to interface data between the memory system 2000 and a user.

The controller 802 may include a configuration of the controller 1200 shown in FIG. 2, and the data storage device 808 may include a configuration of the storage device 1100 shown in FIG. 1.

Figure 10:
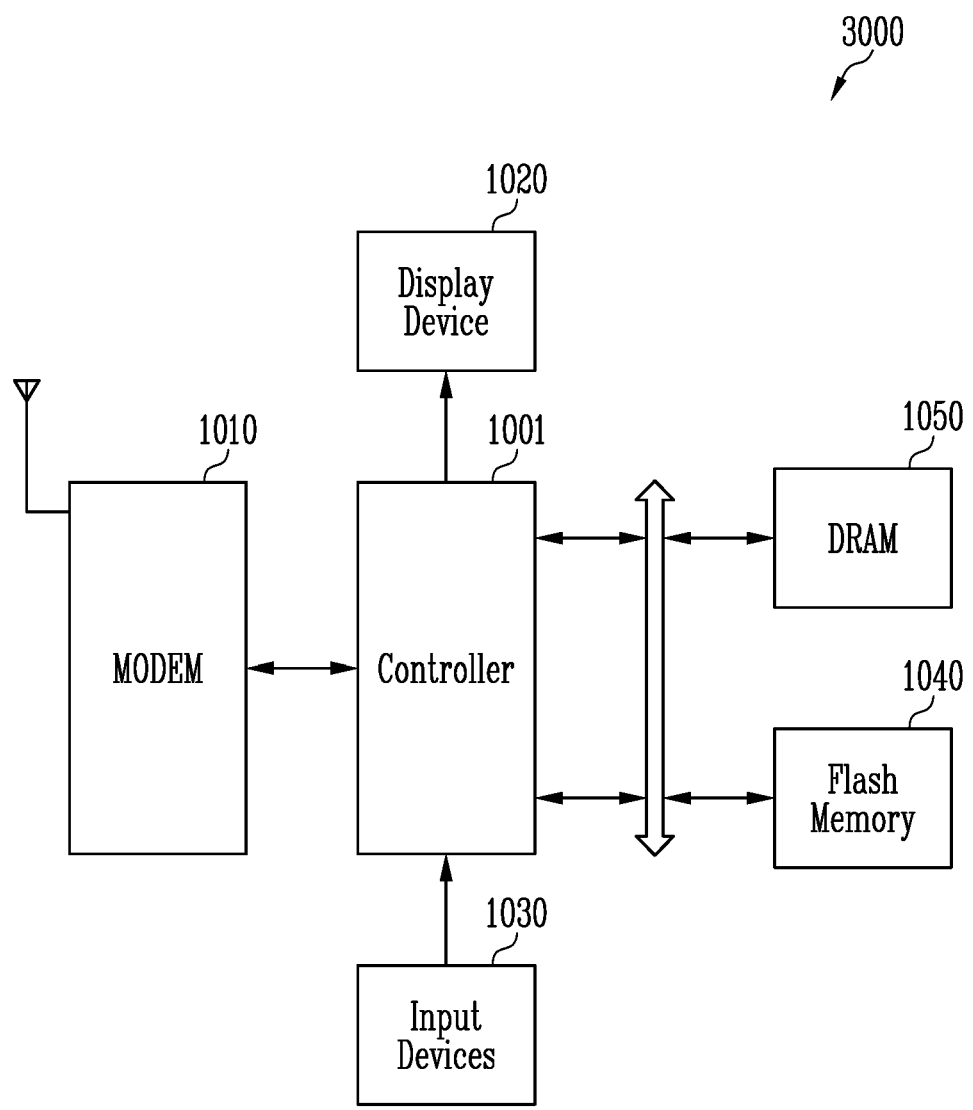
FIG. 10 is a diagram illustrating a mobile device that includes a controller based on some implementations of the disclosed technology.

FIG. 10 is a diagram illustrating a mobile device to which a controller according to an embodiment of the disclosed technology is applied.

Referring to FIG. 10, the mobile device 3000 may include a modem 1010, a controller 1001, a DRAM 1050, a flash memory 1040, a display device 1020, and an input device 1030.

The controller 1001, the DRAM 1050, and the flash memory 1040 may be manufactured or packaged as one chip. The controller 1001 may control an overall operation of the mobile device 3000 according to a preset program. The controller 1001 may include the configuration of the controller 1200 shown in FIG. 2.

The modem 1010 may perform a modulation/demodulation function of communication data. The display device 1020 may include a touch screen as an element such as a liquid crystal having a backlight, a liquid crystal having an LED light source, or an OLED. The display device 1020 may be used as an output device that displays an image such as a letter, a number, and a picture in a color. The input device 1030 may be a device including a numeric key, a function key, and the like, and may interface data between the mobile device 3000 and a user. The flash memory 1040 may be a NOR type or NAND type flash memory. The DRAM 1050 may be used as a main memory of the controller 1001 and may be configured with the storage device 1100 shown in FIG. 1.

The mobile device 3000 may be used as a mobile communication device, but may be used as a smart card or an SSD by adding or subtracting some components in some cases. The mobile device 3000 may be connected to an external communication device through a separate interface. The communication device may be a digital versatile disc (DVD) player, a computer, a set top box (STB), a game machine, or a digital camcorder.

Although not shown in the drawing, the mobile device 3000 may further include an application chipset, a camera image processor (CIS), a mobile DRAM, and the like.

A chip forming the mobile device 3000 may be mounted using various types of packages. For example, the chip may be packaged with package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), metric quad flat pack (MQFP), thin quad flat package (TQFP), small outline intergrated circuit (SOIC), shrink small outline package (SSOP), thin small outline package (TSOP), system in package (SIP), multi-chip package (MCP), wafer-level fabricated package (WFP), wafer-level stack package (WSP), and the like.

Only a few embodiments of the disclosed technology are described. Variations and enhancements to the disclosed embodiments and other embodiments may be made based on what is disclosed in this patent document.

What is claimed is:

1. A memory system, comprising:
a storage device including memory cells for storing data; and
a controller in communication with an external device and configured to control the storage device based on a request from the external device,
wherein the controller is configured to:
generate a read command in response to a self-refresh request received from the external device,
perform an error correction operation of read data read from the memory cells included in the storage device according to the read command,
detect fail bits included in the read data during the error correction operation,
count a number of fail bits detected during the error correction operation,
set a refresh period based on the number of fail bits and a temperature of the controller or the storage device, and perform a refresh operation of re-writing stored data in the memory cells based on the refresh period.

2. The memory system of claim 1, wherein the storage device comprises:
a bank including the memory cells; and
an active circuit configured to supply a precharge voltage to the bank during the refresh operation.

3. The memory system of claim 2, wherein the controller comprises:
a mode selector configured to receive the request from the external device and output a self-refresh mode signal when the self-refresh request is received from an external device;
a command generator configured to output a self-refresh signal and the read command in response to the self-refresh mode signal;
a counter configured to output an address count value for selecting an address in response to the self-refresh signal;
an address controller configured to output a row address for selecting a word line of the bank and an active control signal for selecting the active circuit in response to the address count value;
an error correction engine configured to perform the error correction operation of the read data, count the number of fail bits detected during the error correction operation, and output the number of fail bits;
a temperature sensor configured to sense the temperature of the storage device or a temperature of the controller and output temperature information on the sensed temperature; and
a period controller configured to calculate the refresh period based on the number of fail bits and the temperature information, and output a refresh enable signal according to the refresh period.

4. The memory system of claim 3, wherein the period controller comprises:
an operator configured to receive the number of fail bits and the temperature information and calculate the refresh period based on the number of fail bits and the temperature information;
a buffer configured to store the refresh period; and
a period manager configured to output the refresh enable signal according to the refresh period.

5. The memory system of claim 4, wherein the operator is configured to set the refresh period based on the temperature information, and reset the refresh period according to the number of fail bits.

6. The memory system of claim 4, wherein the operator is configured to adjust the refresh period to be shorter as the temperature increases and to be longer as the temperature decreases, and adjust the refresh period to be shorter as the number of fail bits increases and to be longer as the number of fail bits decreases.

7. The memory system of claim 3, wherein the operator is configured to set the refresh period based on the temperature information, and adjust the refresh period based on the number of fail bits again.

8. The memory system of claim 3, wherein the mode selector is configured to output an end signal to the command generator in response to an end request received from the external device, and the command generator is configured to output a disable signal to the period controller in response to the end signal.

9. The memory system of claim 8, wherein the period controller is configured to stop an output of the refresh enable signal in response to the disable signal.

10. The memory system of claim 3, wherein the mode selector is configured to output a refresh mode signal to the command generator when a refresh request is received from the external device, and the command generator is configured to output a refresh command to the storage device in response to the refresh mode signal.

11. A controller, comprising:

a command generator configured to receive a mode signal that is indicative of an operating mode that is either a refresh mode or a self-refresh mode and output a refresh command in the refresh mode in response to the mode signal or output, in the self-refresh mode, a read command to read data from a storage device in communication with the controller in response to the mode signal and further output, in the self-refresh mode, the refresh command in response to a refresh enable signal;

an error correction engine configured to receive read data from the storage device, perform an error correction operation of the read data, and output a number of fail bits included in the read data;

a temperature sensor configured to measure a temperature of at least one of the controller or the storage device and output temperature information of the measured temperature; and a period controller configured to calculate a refresh period based on the number of fail bits and the temperature information, and output the refresh enable signal based on the refresh period.

12. The controller of claim 11, wherein when the number of fail bits is output, the error correction engine is configured to output a check signal to the temperature sensor.

13. The controller of claim 12, wherein the temperature sensor is configured to output the temperature information to the period controller in response to the check signal.

14. The controller of claim 11, wherein the temperature sensor is configured to measure the temperature of the controller or the storage device, or measure the temperature of the controller and the storage device, and output measured temperature as the temperature information.

15. The controller of claim 11, wherein the period controller comprises:

an operator configured to receive the number of fail bits and the temperature information, and calculate the refresh period based on the number of fail bits and the temperature information;

a buffer configured to store the refresh period; and a period manager configured to periodically output the refresh enable signal based on the refresh period.

16. The controller of claim 15, wherein the operator is configured to set the refresh period based on the temperature information, and adjust the refresh period based on the number of fail bits.

17. The controller of claim 15, wherein the operator is configured to shorten the refresh period as the temperature increases, and lengthen the refresh period as the temperature decreases.

18. The controller of claim 17, wherein the operator is configured to adjust the refresh period to be shorter as the number of fail bits increases, and adjust the refresh period to be longer as the number of fail bits decreases.

19. The controller of claim 11, wherein the command generator is configured to output a disable signal to the period controller in response to an end signal received in the self-refresh mode.

20. The controller of claim 19, wherein the period controller is configured to initialize the refresh period and stop an output of the refresh enable signal in response to the disable signal.

* * * * *